(12) United States Patent
Hummel et al.

(10) Patent No.: US 8,514,371 B2
(45) Date of Patent: *Aug. 20, 2013

(54) IMAGING DEVICE IN A PROJECTION EXPOSURE FACILITY

(75) Inventors: Wolfgang Hummel, Aalen (DE); Juergen Fischer, Heidenheim (DE); Karl-Eugen Aubele, Geislingen/Steige (DE); Erich Merz, Essingen (DE); Raoul Reiner, Pforzheim (DE); Klaus Rief, Aalen-Oberalfingen (DE); Stefan Schoengart, Ulm (DE); Markus Neumaier, Elchingen (DE); Baerbel Trossbach, Aalen (DE); Ulrich Weber, Ulm (DE); Michael Muehlbeyer, Aalen (DE); Hubert Holderer, Oberkochen (DE); Alexander Kohl, Aalen (DE); Jochen Weber, Grosskuchen (DE); Johannes Lippert, Buch am Wald (DE); Thorsten Rassel, Huettlingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 179 days.

This patent is subject to a terminal disclaimer.

(21) Appl. No.: 13/096,112

(22) Filed: Apr. 28, 2011

(65) Prior Publication Data

US 2011/0199597 A1 Aug. 18, 2011

Related U.S. Application Data

(63) Continuation of application No. 12/247,597, filed on Oct. 8, 2008, now Pat. No. 7,961,294, which is a continuation of application No. 11/936,768, filed on Nov. 7, 2007, now Pat. No. 7,710,542, which is a continuation of application No. 10/250,495, filed as application No. PCT/EP02/14380 on Dec. 17, 2002, now Pat. No. 7,304,717.

(30) Foreign Application Priority Data

Dec. 19, 2001 (DE) .................................. 101 62 289
Jun. 7, 2002 (DE) .................................. 102 25 266

(51) Int. Cl.
*G03B 27/52* (2006.01)
*G03B 27/42* (2006.01)

(52) U.S. Cl.
USPC .............................................. 355/55; 355/53

(58) Field of Classification Search
USPC ............... 355/67, 55, 53; 359/618, 823, 819, 359/822, 813
See application file for complete search history.

(56) References Cited

U.S. PATENT DOCUMENTS 4,961,001 A 10/1990 Liegel et al.
5,822,133 A 10/1998 Mizuno et al.
(Continued)

FOREIGN PATENT DOCUMENTS

DE 37 33 823 4/1989
DE 197 15 226 10/1998
(Continued)

OTHER PUBLICATIONS

Pohl, "Dynamic piezoelectric translation devices," Review of Scientific Instruments, 58(1):54-57, 1987.
(Continued)

*Primary Examiner* — Peter B Kim
(74) *Attorney, Agent, or Firm* — Fish & Richardson P.C.

(57) ABSTRACT

An imaging device in a projection exposure machine for microlithography has at least one optical element and at least one manipulator, having a linear drive, for manipulating the position of the optical element. The linear drive has a driven subregion and a nondriven subregion, which are movable relative to one another in the direction of a movement axis. The subregions are interconnected at least temporarily via functional elements with an active axis and via functional elements with an active direction at least approximately parallel to the movement axis.

20 Claims, 7 Drawing Sheets

(56) References Cited

U.S. PATENT DOCUMENTS

| | | | |
|---|---|---|---|
| 5,923,473 | A | 7/1999 | Kelley et al. |
| 5,986,827 | A | 11/1999 | Hale |
| 6,150,750 | A | 11/2000 | Burov et al. |
| 7,304,717 | B2 | 12/2007 | Hummel et al. |
| 7,710,542 | B2 | 5/2010 | Hummel et al. |
| 7,961,294 | B2 | 6/2011 | Hummel et al. |
| 2001/0038500 | A1 | 11/2001 | Shibazaki |
| 2003/0226976 | A1 | 12/2003 | Tanaka |
| 2004/0042094 | A1 | 3/2004 | Matsuyama |
| 2004/0263812 | A1 | 12/2004 | Hummel et al. |
| 2008/0174757 | A1 | 7/2008 | Hummel et al. |
| 2009/0040487 | A1 | 2/2009 | Hummel et al. |

FOREIGN PATENT DOCUMENTS

| | | |
|---|---|---|
| DE | 199 10 295 | 9/2000 |
| DE | 199 10 947 | 9/2000 |
| EP | 0 360 975 | 4/1990 |
| EP | 1 311 007 | 5/2003 |
| GB | 2316222 | 2/1998 |
| JP | 3064372 | 5/1992 |
| WO | WO 03/052511 | 6/2003 |
| WO | WO 2007/071353 | 6/2007 |

OTHER PUBLICATIONS

Von Randow, "It's Time to Jerk the Tablecloth Off the Table," Zeit Online, 23/2004 p. 43 [http://www.zeit.de/2004/23/I-Attocube] (English translation).

Office Action for corresponding Application No. EP 02 798 340.2, dated Aug. 9, 2010.

Office Action for corresponding Application No. EP 02 798 340.2, dated May 25, 2009.

International Search Report for corresponding PCT Application No. PCT/EP2002/014380, dated Dec. 8, 2003 (Mailing Date: Dec. 16, 2003).

International Search Report for corresponding PCT Application No. PCT/EP2006/012174, dated Apr. 5, 2007 (Mailing Date: Apr. 16, 2007).

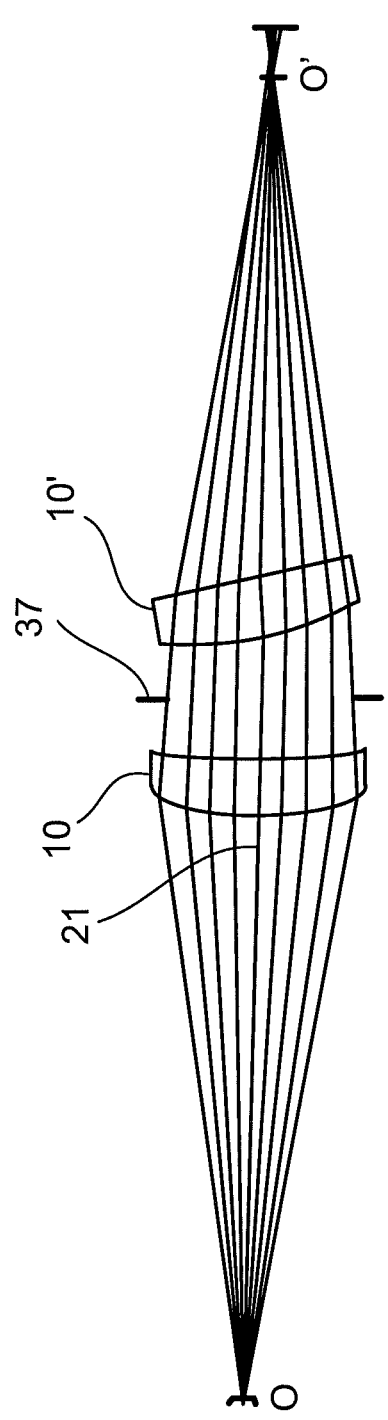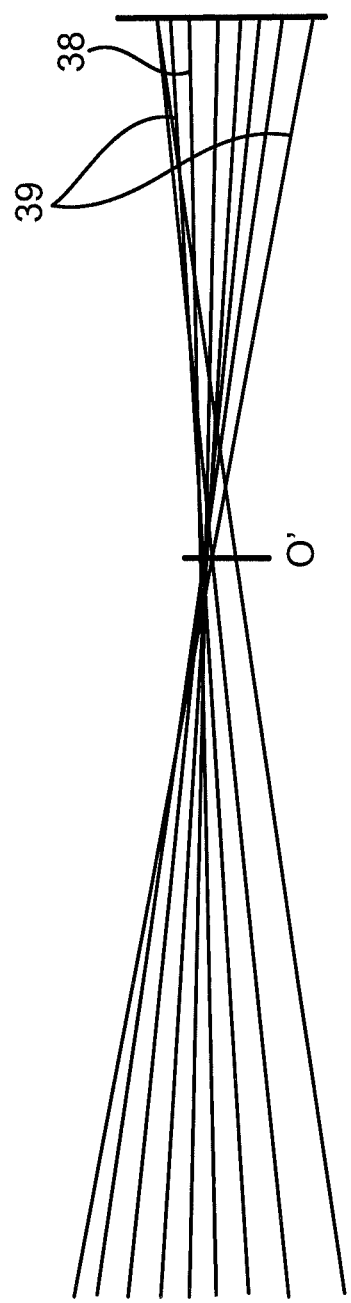

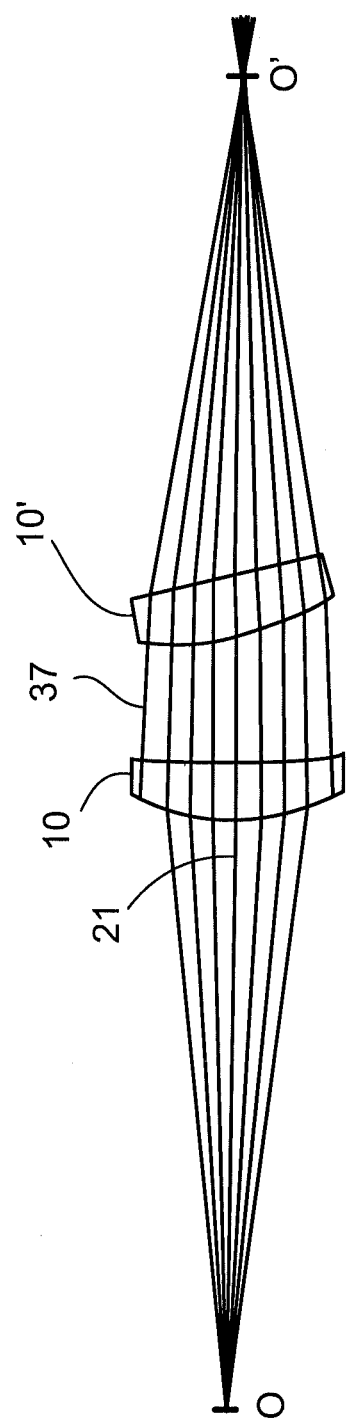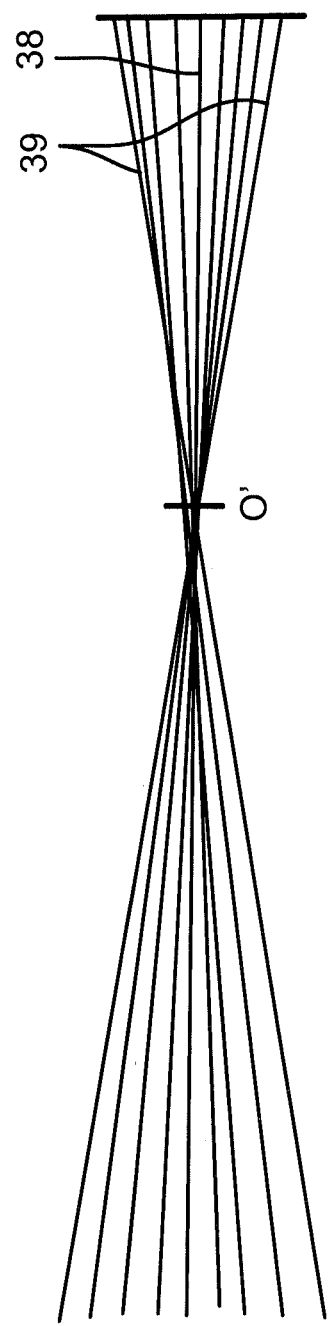

IMAGING DEVICE IN A PROJECTION EXPOSURE FACILITY

CROSS-REFERENCE TO RELATED APPLICATIONS

This application is a continuation of U.S. patent application Ser. No. 12/247,597, filed Oct. 8, 2008, which is a continuation of U.S. patent application Ser. No. 11/936,768, filed Nov. 7, 2007, which is a continuation of U.S. patent application Ser. No. 10/250,495, filed on Aug. 20, 2004, now U.S. Pat. No. 7,304,717, which is a National Stage Entry of PCT/EP02/14380, filed on Dec. 17, 2002, which claims benefit of DE 102 25 266.1, filed on Jun. 7, 2002, and of DE 101 62 289.9, filed on Dec. 19, 2001.

BACKGROUND

1. Field of the Invention

The invention relates to an imaging device in a projection exposure machine for microlithography, having at least one optical element and at least one manipulator, having a linear drive, for manipulating the position of the optical element.

2. Description of the Related Art

In the case of such imaging devices for projection exposure machines in lithography, also denoted lithographic optics for short, it is often advantageous if individual optical elements can be positioned actively during adjustment and/or during operation, in order to set specific imaging properties and aberrations precisely. Thus, for example, in rotationally symmetrical imaging systems, adjusting optical elements while maintaining the rotational symmetry, for example in the case of rotationally symmetrical refractive objectives, permits the displacement of lenses in the light direction (defined in the direction of the z-axis), the influencing of the focus, of the reduction ratio, of the 3rd order distortion, of the field curvature, of linear coma and of the constant spherical aberration. Moreover, environmental influences of a rotationally symmetrical nature, for example a change in the atmospheric ambient pressure, in the internal pressure, in the atmospheric humidity and in the temperature including longitudinal temperature gradients as well as rotationally symmetrical components of the lens heating can be corrected, as is known from U.S. Pat. No. 4,961,001 and DE 37 33 823.

In the case of rotationally symmetrical imaging systems, adjusting optical elements in conjunction with cancellation of the rotational symmetry and production of monochromatic symmetry for example in the case of rotationally symmetrical refractive objectives, permits lenses to be displaced perpendicular to the z-axis, specifically in the x-y plane, also termed lens decentering, or the tilting of lenses about axes perpendicular to the light direction, and the exertion of influence on centering errors that are expressed in nonrotationally symmetrical aberration profiles of monochromatic overall symmetry with reference to pupil and field. Included therein are, for example, image offset, sagittal and tangential 2nd order distortion, linear image surface tilt and the constant coma. Furthermore, environmental influences of monochromatic symmetry, for example gradients of ambient pressure, internal pressure, air humidity and temperature perpendicular to the light direction, can be corrected.

Moreover, it is very advantageous in catadioptric lithographic optics with plane deflecting mirrors or beam splitter cubes to be able to manipulate the position and tilting angles of the deflecting mirror or beam splitter surfaces. For concave and convex reflecting surfaces in catadioptric or catoptric lithographic optics, it is also suitable to manipulate the degrees of freedom in translation and tilting, in order to be able to set rotationally symmetrical aberrations and centering errors precisely.

Such imaging devices with manipulators are known in this case from the prior art.

For example, details may be given here of such a manipulator with the aid of the design described in U.S. Pat. No. 5,822,133. The manipulator there is designed as a pure z-manipulator in the cases of application described. This means that the manipulation is performed in the direction of the optical axis normally denoted by "z". The design comprises two annular elements which are arranged one in another and can be moved relative to one another by actuators over a range of embodiments. Provided for guiding the parts relative to one another are leaf springs or, in accordance with a further refinement, diaphragms that are intended to ensure parallel movement of the two parts relative to one another.

However, such a design has decisive disadvantages, depending on embodiment, in particular on the embodiment of the various actuators described. Thus, for example, when pneumatic actuators are used it is possible to achieve only a relatively low rigidity in design. When vibrations are correspondingly introduced, and when use is made of very heavy optical elements, for example the very heavy lenses that are used in microlithography or in astronomical applications, this low rigidity of the manipulator leads to severe disadvantages that have very negative effects on the imaging quality to be attained.

The use of hydraulic actuators is proposed in a further refinement. It is certainly possible to attain a far higher rigidity with such actuators than with the pneumatic actuators previously described. However, the hydraulic actuators harbor the risk of the components to be manipulated being contaminated by the hydraulic fluid, in general an oil, should there be a leak. Such a contamination with hydraulic fluid is to be regarded as a severe disadvantage particularly in the case of high-performance objectives such as are used, for example, in microlithography. Such objectives are usually filled with a defined gas mixture or else are evacuated, if appropriate. Should hydraulic fluid, in particular oil, pass into this ultraclean interior, this can pass as liquid or vapor into the region of the optical elements and be deposited on their surface. The imaging quality would then be severely degraded. The outlay on any possible cleaning would be extremely high.

Furthermore, appropriate actuators made from piezoelectric elements and lever gears are described in an alternative embodiment of the above-named document. In this case, the levers of the gears can be interconnected particularly via solid joints. This type of actuators can avoid the two above-named disadvantages. In this case, very good resolutions can be achieved with these actuators. However, these actuators have the severe disadvantage that they permit only a very small travel. Depending on application, in particular in the use, already mentioned repeatedly, in an imaging device for microlithography, the requirement for very good resolution is, however, mostly additionally accompanied by the requirement for a very large travel in relation to the possible resolution. These requirements, which often cannot be avoided for the purpose of attaining a very good imaging quality, cannot be attained by the design described in the above-named US document, and so said design disadvantageously fails to permit the desired imaging quality.

Further manipulators, which have, however, the same or very similar disadvantages, are described, for example, by DE 199 10 947 A1. This document exhibits a design in which movement of the optical element along the optical axis is achieved via actuators, for example piezoelectric elements, and a corresponding gear made from levers connected via solid joints.

A device for manipulating an optical element in a plane perpendicular to the optical axis is specified, for example, by DE 199 10 295 A1. There is a need in this case for at least two actuators that, because of the movement accuracies to be attained with these actuators, act via expensive and complex lever devices on an inner ring of the mount that carries the optical element. In order to ensure a uniform and adequate rigidity of the lever devices, and thus of the joining of the two parts of the mount to one another, as well to ensure an adequate resolution of the movement, there is a substantial outlay with respect to production, in particular with respect to the observance of very narrow manufacturing tolerances.

Furthermore, JP 3064372 discloses a device for manipulating optical elements in the case of which a first group of optical elements and a second group of optical elements are arranged such that they can be displaced along an optical axis by a manipulator. These two optical groups can also execute a tilting movement relative to the optical axis with the aid of the manipulator device. Electrostrictive or magnetostrictive elements can be used for the drives. The design of the rotary actuators is not disclosed directly in an unambiguous fashion in this document.

Reference may also be made regarding the further prior art to U.S. Pat. No. 6,150,750, which exhibits a linear drive for the field of electrical engineering, telecommunication engineering and automation. The linear drive has a driven subregion and a nondriven subregion that can be moved relative to one another in the direction of a movement axis, the subregions being interconnected at least temporarily via piezoelectric elements that are designed in part as lifting piezoelectric elements and in part as shearing piezoelectric elements. The individual piezoelectric element stacks, which comprise lifting and shearing piezoelectric elements in each case, can be brought by means of the lifting piezoelectric elements into frictional grip relative to the driven subregion, or can be raised thereby. The actual movement can then be realized via the shearing piezoelectric elements of those stacks that are in frictional engagement. It is possible thereafter to conceive of moving on to other stacks, and so very large movement ranges can be realized.

This design of the linear drives results in practice in an actuator that is capable, via its piezoelectric elements, of exerting holding forces and forces in the direction of the movement axis on the two parts of the linear drive. It is thereby possible to implement a linear stepper that, depending on the selection of the piezoelectric elements, has a very good resolution and, on the basis of the possibility of moving on, also has a very large allowance for movement.

SUMMARY

It is the object of the invention to create an imaging device for a projection exposure machine in microlithography comprising a manipulator that permits a very rigid configuration and a very good ratio of resolution to lift for movements that are to be executed by the manipulator.

According to the invention, this object is achieved by virtue of the fact that for the manipulator use is made in the imaging device in the projection exposure machine for microlithography of a linear drive that has a driven subregion and a nondriven subregion, which are movable relative to one another in the direction of a movement axis, the subregions being interconnected at least temporarily via functional elements with an active direction at least approximately perpendicular to the movement axis and via functional elements with an active direction at least approximately parallel to the movement axis.

The design of the manipulator with the linear drive described above results in an ideal manipulator for microlithography. In this case, the direction in which the manipulation is to be performed and the number of the linear drives used in the manipulator are unimportant. The advantageous properties follow from the type of the linear drives per se.

Thus, depending on the functional elements used it is possible with the aid of the design to conceive, for example, of very high resolutions of down to a few fractions of nanometers, it also being possible to realize a very large extent of movement (range) through the possibility of moving on during the movement of the linear drive. Ratios of resolution to range of the order of magnitude of 1:75 000 or better are conceivable in this case.

These ideal properties are associated with a very high adjusting speed of more than 5 µm/s in conjunction with a very high possible adjusting force of more than 100 N.

The design of the linear drives themselves already allows a very high rigidity. The rigidity can often be raised further because of the fact that it is frequently possible to dispense with a gear.

Functioning as a whole takes place in this case virtually without the development of heat by the linear drive (Q<10 mW). This constitutes a particular advantage in the case of use in the field of imaging devices for microlithography, since the development of heat and the thermal expansion associated therewith can give rise to great problems with regard to dimensional accuracy and the accuracy to be attained.

Furthermore, the linear drives have a very long service life and a very small construction space given the known boundary conditions.

In accordance with a particularly advantageous development of the invention, the functional elements are designed as piezoelectric elements.

Such a piezoelectric linear drive can in this case ideally fulfill the very high and complex requirements that are set by the lithographical optics mentioned at the beginning.

The design of the functional elements now as shearing piezoelectric elements and now as lifting piezoelectric elements permits a very accurate infeed in the case of holding lifting piezoelectric elements via the resolution of the shearing piezoelectric elements, which is high in principle. The typically required positioning accuracies in the range of a few hundredths of nanometers to a few nanometers can thereby be attained. The typical optical element travels of the order of magnitude of a few 10 to 100 µm can also be achieved without a problem through the possibility of operating the linear drive in step mode. The accuracy of the total path traveled is also of the above-named order of magnitude owing to the composition of the total path traveled from individual parts with the accuracy specified above. The piezoelectric linear drives therefore achieve the ratio, resulting from the range of the aberrations to be set and the required setting accuracy, of the maximum travel to the required mechanical positioning accuracy of the order of magnitude of $10^5$ to $10^7$.

Required positioning forces of the order of magnitude of 10 to 100 N, and holding forces below shock loading, for example in the case of transport, which can be up to an order of magnitude higher, result from the masses of the optical elements to be manipulated and their mounts. The piezoelectric linear drives can likewise yield these holding and positioning forces, as also a very high rigidity in the adjusting direction. This high rigidity which, depending on the purpose of use, ranges from a few N/µm to a few 100 N/µm, permits a mechanical natural frequencies of the optical elements of a few hundred Hertz to be attained in a particularly advantageous way.

Because of the very high ratio of maximum travel to the required mechanical positioning accuracy of the piezoelectric linear drives, it is possible in a particularly favorable way for the latter to be of gearless design. A return game can thereby be avoided, or at least minimized, and parasitic movements in the directions perpendicular to the desired direction of movement can be suppressed.

In order to be able to realize this in an ideal way, the drive must be arranged as close as possible to the optical element, and this in turn substantially restricts the construction space available. Thus, for example, in the case of refractive systems it is advantageous for the drive to be fully integrated into the cylindrical outer contour of the objective. Owing to the very small design, possible in principle, of the piezoelectric linear drives, the dimensions of each individual drive in each direction are only a few centimeters. The integration is therefore easily possible in particular favorable way.

Integrating the piezoelectric linear drive into the lens mount also results in the requirement for a low development of heat, since thermal expansions and stresses in the region of the optical elements must be avoided at all costs, in order to achieve the appropriately high imaging quality required in the field of microlithography. As piezoelectric elements are known to have a low development of heat, it is possible to implement heat developments of less than 10 mW in each of the piezoelectric linear drives. The integration of the piezoelectric linear drive into the imaging device in the region of the optical elements therefore also does not constitute a problem from this point of view.

Adjusting speeds of a few μm/s between individual exposures are typically required in the field of lithographic optics. Since the shearing piezoelectric elements can react very quickly, it is possible to meet these requirements, since the adjustments are normally performed with such small adjustment paths that the analog mode of the piezoelectric linear drives, that is to say the pure adjustment via the shearing piezoelectric elements or a raising or sinking of the lifting piezoelectric elements, is sufficient for the purpose.

By contrast, the entire traveling range is required over the entire service life of a system of more than 10 years. This can be achieved with the aid of the piezoelectric linear drives, since these can advantageously hold their position at one end of the traveling range without having to be permanently under electric tension for the purpose. Again, the average electric voltage across the piezoelectric linear drives that is present over the service life can be selected to be low without greatly impairing their mode of operation. This also has a very advantageous effect on the service life and the long term reliability.

It is, moreover, advantageous for transport that the piezoelectric linear drive can be of self-locking design and is also designed in accordance with the examples of application still to follow later, that is to say can keep its position without the presence of a voltage.

The properties of the piezoelectric linear drive that have been stated above ideally fulfill the requirements that must be fulfilled for the tasks of manipulation in a projection exposure machine for microlithography. Here, these requirements are basically always the same irrespective of the actual task of manipulation and the direction of travel associated therewith. The use according to the invention of the piezoelectric linear drive therefore opens up advantages with regard to all the requirements specified above in virtually all tasks of manipulation that can occur in such an imaging device, in particular with regard to the manipulation of optical elements in the three orthogonal x-, y- and z-directions, as well as with regard to instances of tilting and/or rotation about these directions.

In an aspect, the disclosure features a manipulator for an optical element that is fitted on a movable part, the movable part and a fixed part being connected via at least three bar elements that are linked via joints to the movable part and to the fixed part, and that are arranged at least approximately in one plane, and via three linear drives whose movement axes are at least approximately perpendicular to the plane and whose points of intersection with the plane form a triangle.

The joints can be designed as solid joints. All the bar elements can be arranged at least approximately in precisely one plane. All the bar elements can be arranged at least approximately radially to the optical axis of the optical element.

In another aspect, the disclosure features a manipulator for an optical element that is fitted to a movable part, the movable part and a fixed part being connected via an annular disk that is linked via circumferential solid joints to the movable part and to the fixed part, and via three linear drives whose movement axes are at least approximately perpendicular to the plane of the annular disk and whose points of intersection with the plane form a triangle.

The movement axes can run at least approximately in the direction of the optical axis of the optical element. The linear drives can have at least one drive element. The linear drives can have at least one gear element.

Each of the linear drives can have a driven subregion and a non-driven subregion, which move relative to one another in the direction of the movement axis, the subregions being at least temporarily connected to one another via functional elements with an active direction at least approximately perpendicular to the movement axis, and via functional elements with an active direction at least approximately parallel to the movement axis.

The functional elements with the active direction at least approximately perpendicular to the movement axis can be designed as clamping elements via which it is possible to achieve clamping of the two subregions against one another, or via which clamping of the two subregions applied by a prestressing force can be released, and in that the functional elements with the active direction at least approximately parallel to the movement axis are designed as feed elements for moving the two subregions against one another.

Each of the linear drives can have a parallel guide that guides the two subregions at least approximately parallel to one another. The parallel guide can have two bars that are respectively connected via solid joints to the subregions, and that are arranged at least approximately parallel to one another. The functional elements can be designed as piezoelectric elements. The functional elements with the active direction at least approximately perpendicular to the movement axis can be designed as lifting piezoelectric elements, and the functional elements with the active direction at least approximately parallel to the movement axis are designed as shearing piezoelectric elements, the functional elements being combined to form a number of piezoelectric stacks that respectively have lifting and shearing piezoelectric elements.

The connection of the movable part and of the fixed part via the linear drives can be designed in such a way that one of the subregions is permanently connected to the fixed part, and in that the other subregion is connected to the movable part in such a way that the connection is decoupled with reference to movements perpendicular to the movement axis.

The position of the movable part relative to the fixed part can be detected via at least three sensors. The sensors can be designed at least partially as absolutely measuring sensors.

The sensors can be designed as optical position transducers. The optical position transducers can have a phase grating scale. The distances by which each of the linear drives can be moved can be controlled or regulated as a function of the position, detected by the sensors, of the movable part relative to the fixed part.

Advantageous developments and refinements of the invention follow from the remaining subclaims and from the exemplary embodiments described below in principle with the aid of the drawing, in which:

DESCRIPTION OF DRAWINGS

FIG. 9a shows an illustration of an optical system with two lenses in the case of uncorrected coma;

FIG. 9b shows an enlarged section of the caustic of the coma illustrated in FIG. 9a;

FIG. 10a shows an illustration of the optical system known from FIG. 9a, in the case of approximately corrected coma;

FIG. 10b shows an enlarged section of the caustic of the approximately corrected coma illustrated in FIG. 10a;

DETAILED DESCRIPTION

Figure 1:
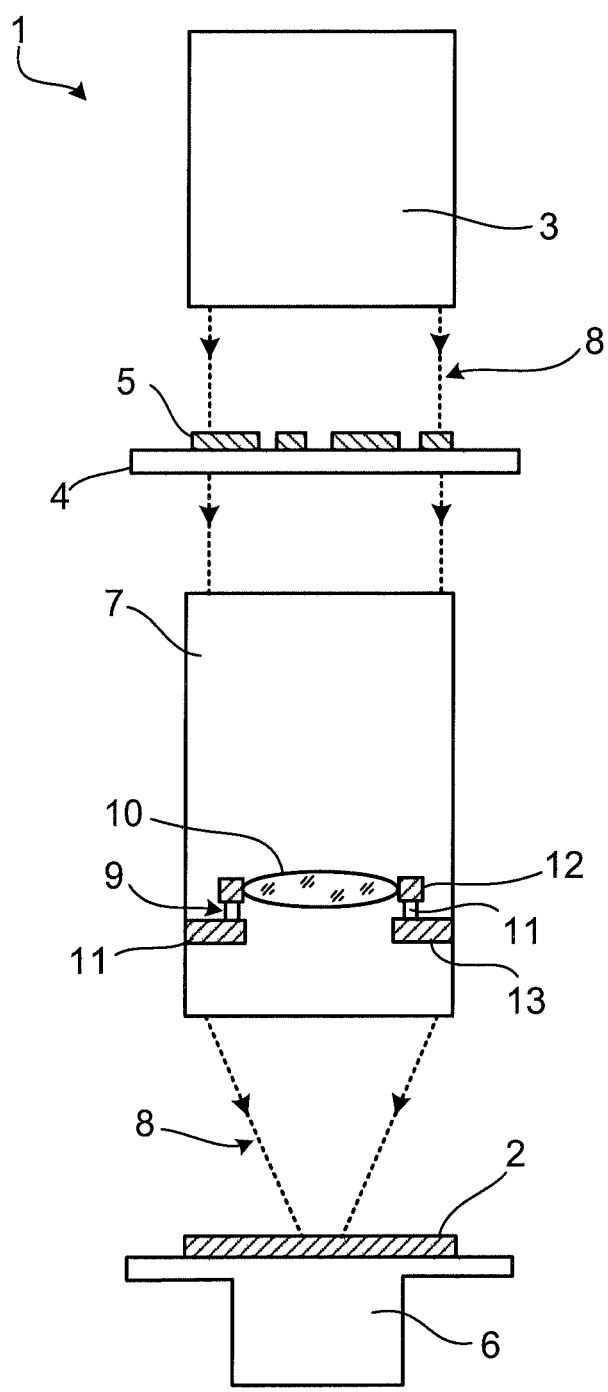
FIG. 1 shows a sketch of the principle of a projection exposure machine for microlithography, which can be used to expose structures onto wafers coated with photosensitive materials.

A projection exposure machine 1 for microlithography is illustrated in FIG. 1. Said machine serves for exposing structures on a substrate coated with photosensitive materials, which consists in general predominantly of silicon and is denoted as a wafer 2, for producing semiconductor components such as, for example, computer chips.

The projection exposure machine 1 essentially comprises in this case an illumination system 3, a device 4 for holding and exactly positioning a mask provided with a grating-type structure, a so-called reticle 5, by means of which the later structures on the wafer 2 are determined, a device 6 for holding, moving on and exactly positioning this very wafer 2, and an imaging device 7.

The basic functional principle provides in this case that the structures introduced into the reticle 5 are exposed onto the wafer 2, in particular with a reduction in the structures to a third or less of the original size. The requirements that are to be placed on the projection exposure machine 1, in particular on the imaging device 7, with regard to the resolutions are in the sub-µm range in this case.

After exposure has been performed, the wafer 2 is moved on such that there are exposed on the same wafer 2 a multiplicity of individual fields, each having a structure prescribed by the reticle 5. Once the entire surface of the wafer 2 has been exposed, the latter is removed from the projection exposure machine 1 and subjected to a plurality of chemical treatment steps, generally the removal of material by etching. If appropriate, a plurality of these exposure and treatment steps are traversed one after another until a multiplicity of computer chips have been produced on the wafer 2. Because of the stepwise feed movement of the wafer 2 in the projection exposure machine 1, the latter is frequently also denoted a stepper. By contrast, in the case of wafer scanners the reticle 5 must be traveled over relative to the wafer 2 in order thus to be able to image the reticle structure as a whole.

The illumination system 3 provides projection radiation required for imaging the reticle 5 on the wafer 2, only one projection beam 8 being illustrated here for the principle, for example light or a similar electromagnetic radiation. A laser or the like can be used as source for this radiation. The radiation is shaped in the illumination system 3 via optical elements such that, upon impinging on the reticle 5, the projection radiation has the desired properties with regard to telecentrism, uniform polarization, homogeneous transmission with reference to field and angle, the lowest possible coherence of the beams relative to one another, and the like.

An image of the reticle 5 is generated via the projection beam 8, and is transmitted, appropriately reduced, by the imaging device 7 onto the wafer 2, as has already been explained above. The imaging device 7, which can also be denoted objective, in this case comprises a multiplicity of individual reflective, refractive and/or diffractive optical elements such as, for example, lenses, mirrors, prisms, plane plates and the like.

Also part of the imaging device 7 is at least one manipulator 9, which is indicated here only schematically. The manipulator serves to manipulate the position of an optical element 10, to which it is connected, in order to improve the achievable imaging quality. The manipulator 9 in this case comprises a linear drive 11 with the aid of which a part 12 of the manipulator 9 that is permanently connected to the optical element and is movable relative to the imaging device 7 can be moved relative to a part 13 permanently connected to the imaging device 7.

Figure 2:
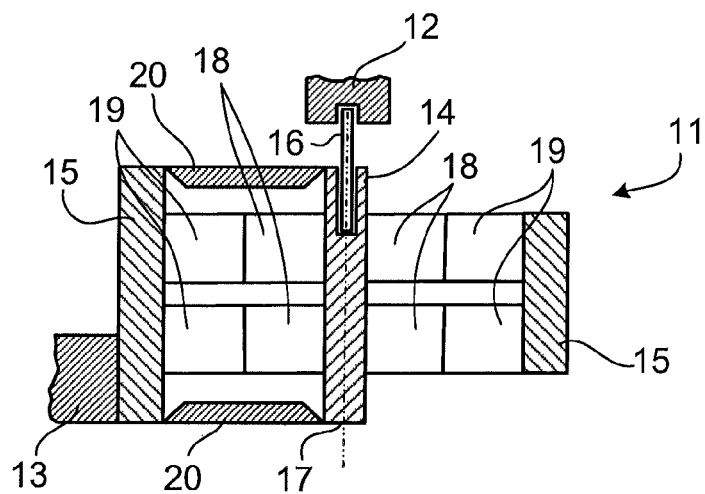
FIG. 2 shows an illustration of the principle of the linear drive.

The linear drive 11, which is illustrated in principle in FIG. 2, comprises a driven subregion 14 and a nondriven subregion 15. The nondriven subregion 15 is permanently connected to the fixed part 13, as is indicated here in principle. The driven subregion 14 is connected to the movable part 12. The connection of the movable part 12 and the driven part 14 is realized in this case via a pin 16, located in a bore, in such a way that the connection is decoupled with reference to movements perpendicular to the movement axis 17 of the linear drive 11.

The connection of the driven subregion 14 and the nondriven subregion 15 is performed in the case of the linear drive 11 in the embodiment illustrated here via eight different functional elements, of which at least four temporarily interconnect the two subregions 14, 15 by frictional grip. In each case four of the functional elements are designed such that they have an active direction perpendicular to the movement axis 17. These functional elements are marked in FIGS. 3a-3f by the reference numeral 18. Further functional elements, whose active direction runs in the direction of the movement axis 17, are located between these functional elements 18 and the driven subregion 14 as well as the nondriven subregion 15. These further functional elements are marked by the reference numeral 19.

In accordance with a particularly favorable embodiment, the functional elements 18, 19 can be designed as piezoelectric elements. The functional elements denoted by the reference numeral 18 could then be designed as lifting piezoelectric elements 18, while the functional elements denoted by the reference numeral 19 are implemented as shearing piezoelectric elements 19. This results in the possibility of a movement cycle such as will be explained further later in the context of FIG. 3a to FIG. 3f.

As is indicated in the exemplary embodiment illustrated here, it is possible to avoid parallel guidance between the two subregions 14, 15 in order to achieve a parallel movement in the direction of the movement axis 17 of the driven subregion 14 relative to the nondriven subregion 15. In accordance with the embodiment illustrated here, the parallel guidance comprises two bars 20 that are respectively connected via joints, in particular via solid joints, to the driven subregion 14 and the nondriven subregion 15. This ensures that the driven subregion 14 is moved in a parallel fashion relative to the nondriven subregion 15, that is to say executes a movement in the direction of the movement axis 17.

The movement cycle of the linear drive 11 is explained in more detail below with reference to the following FIGS. 3a to 3f.

Figure 3A:
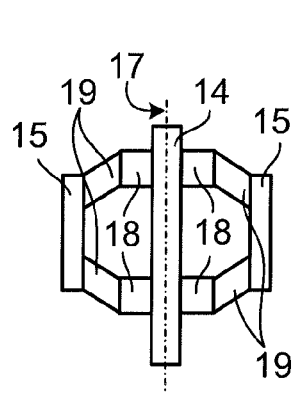
FIGS. 3a to 3f show an illustration of the functional principle of the linear drive in accordance with FIG. 3.
Figure 3B:
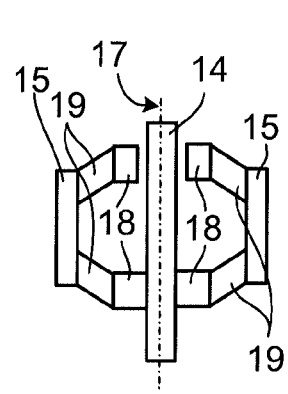
Figure 3C:
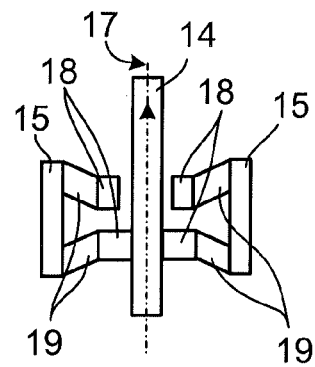
Figure 3D:
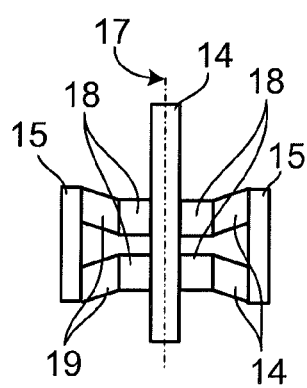
Figure 3E:
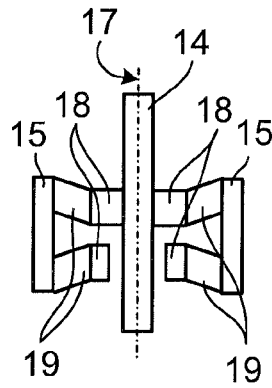
Figure 3F:
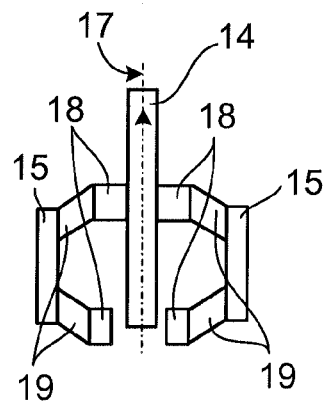

FIG. 3a shows the driven subregion 14 and the nondriven subregion 15, together with the functional elements 18, 19, in an illustration of the principle. The driven subregion 14 is clamped in relation to the nondriven subregion 15 via the four lifting piezoelectric elements 18. The following step in the movement cycle is illustrated in FIG. 3b, in which two of the lifting piezoelectric elements 18 are opened, that is to say no longer in engagement, such that it is possible to move the driven subregion 14 relative to the nondriven subregion 15 by means of the two shearing piezoelectric elements 19 arranged in the region of the still clamping lifting piezoelectric elements 18. This movement is illustrated in principle in FIG. 3c. FIG. 3d shows the next step if a very large movement of the driven subregion 14 relative to the nondriven subregion 15 is desired. The driven subregion 14 is securely clamped again by a renewed actuation of the lifting piezoelectric elements 18. The clamping via the two other lifting piezoelectric elements 18 is now released, as is to be gathered from FIG. 3e. FIG. 3f then illustrates the next step, in which the driven subregion 14 is moved on in turn via the actuation of the shearing piezoelectric elements 19.

This principle of the movement cycle can be repeated as desired and executed in any desired directions. In the clamped state, the linear drive 11 in this case respectively has a very high accuracy of movement, which stems from the accuracy of the shearing piezoelectric elements 19. In addition to this very high accuracy, it is also possible to realize a very large movement range via the possibility of moving on by means of the lifting piezoelectric elements 18, such that it is possible here to implement an ideal ratio of resolution to movement range.

It is fundamentally possible in this case to conceive of different types of actuation of the linear drive 11 of the type described above. If self-locking of the linear drive 11 is desired, the latter can be designed such that the functional elements 18, 19 are prestressed via spring means (not illustrated here) against the driven subregion 14. This ensures that the functional elements 18, 19 are always, that is to say in the case of non-actuation, in frictional engagement, and thus secure the position of the driven subregion 14 relative to the nondriven subregion 15 by clamping. By actuating the lifting piezoelectric elements 18, this clamping can then be cancelled in the region of these actuated lifting piezoelectric elements 18 to such an extent that there is no longer a frictional connection here between the driven subregion 14 and the nondriven subregion 15. The further cycles could then be realized as already described above. This design is particularly favorable in addition, since the service life of the piezoelectric functional elements 18, 19 can be lengthened by the prestressing that can be applied to the piezoelectric elements. However, another design would also be conceivable in principle, in which clamping between the driven subregion 14 and the nondriven subregion 15 is implemented only given active energization of the lifting piezoelectric elements 18.

Such linear drives 11 are now suitable for the high requirements, already mentioned in the context of the introduction to the description, that are placed on tasks of manipulation in the region of imaging devices 7, irrespective of whether what is involved is a manipulation perpendicular to the optical axis, a tilting manipulation or a manipulation in the plane perpendicular to the optical axis. On the basis of this very general applicability of the above-named linear drives 11 with their appropriate action for virtually all the areas of microlithography in which elements participating in the photolithographic process are to be manipulated with regard to their position, the aim in the following figures is to examine the principle of three examples, without intending to restrict the application of the linear drives 11 to these specific tasks of manipulation from the field of an imaging device 7 for microlithography.

Figure 4:
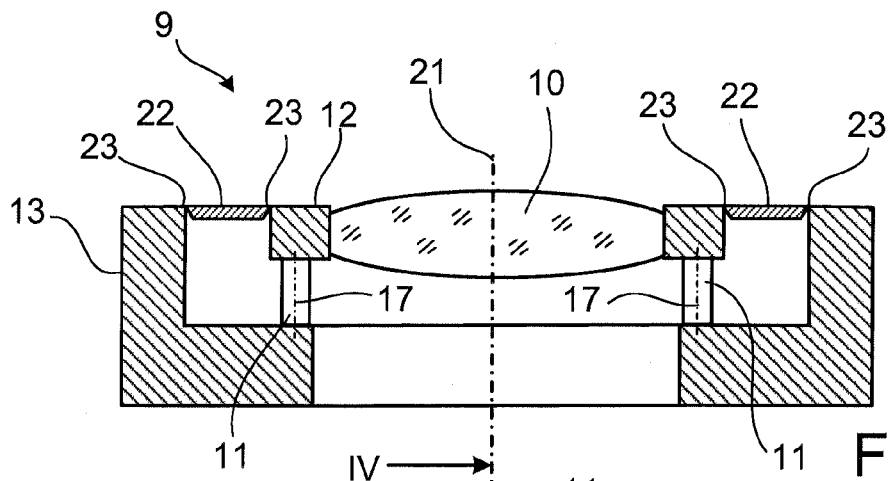
FIG. 4 shows an illustration of the principle of a manipulator for manipulating an optical element in the direction of its optical axis.

Illustrated in FIG. 4 is a cross section through the manipulator 9, which can be used for manipulating the optical element 10, a lens 10 in the exemplary embodiment selected here, along its optical axis 21. Tilting of the optical element 10 is also conceivable in addition to a pure movement in the direction of the optical axis 21, which is denoted in general by "z".

For the purpose of manipulation, the movable part 12, here a movable inner ring that carries the optical element 10, is moved closer to the fixed part 13, here a fixed outer ring 13, connected to the imaging device 7, for example, via three of the linear drives 11, of which two are visible here in principle.

In order to guide the movable part 12 relative to the fixed part 13, there is provided in the exemplary embodiment illustrated here an annular disk 22 that is connected via circumferential solid joints 23 both to the fixed part 13 and to the movable part 12. The movable part 12 can be moved relative to the fixed part 13 by the linear drives 11, whose movement axes 17 run at least approximately parallel to the optical axis 21, the annular disk 22 achieving a guidance of the movable part 13 such that the latter experiences no deflection in the plane perpendicular to the movement axes 17.

The exact design of the guides plays only a subordinate role for the explanations present here, and so it is to be mentioned here only that the annular disk 22 per se is designed with a relatively large wall thickness. Consequently, virtually no deformations of any sort occur in the annular disk 22. All the deformations that occur in the region of such a guide element will take place in the region of the circumferential solid joints 23. Since these solid joints 23 are arranged at very precisely defined positions, the behavior of such a guide element can be determined in advance exactly and very easily from the annular disk 22. Moreover, it is possible to implement a very high rigidity of the design, and thus a very high natural frequency.

Figure 5:
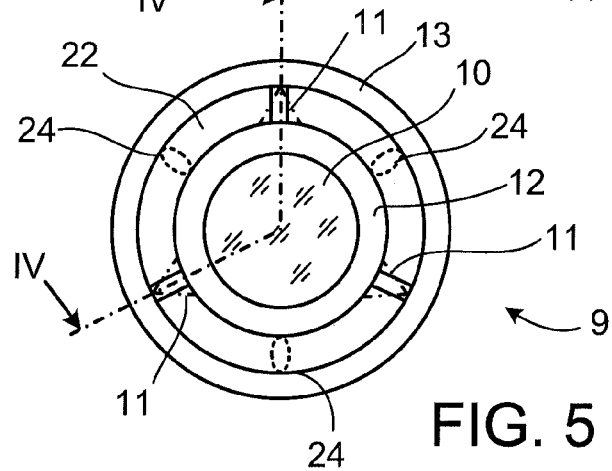
FIG. 5 shows a plan view of the manipulator in accordance with FIG. 4.

A plan view of a the manipulator 9 thus designed is to be seen in FIG. 5. Visible once again is the fixed part 13 and the movable part 12 with the optical element 10. The guidance of the movable part 12 and the fixed part 13 is performed via the annular disk 22. Located in the region below the annular disk 22 are the three linear drives 11, which are indicated here in the form of a triangle. Visible in addition to this are three sensors 24, which are indicated here in principle by means of oval structures. The sensors 24 are respectively arranged at an angle of 120° to one another and at an angle of 60°, respectively, relative to the linear drives 11. The exact position of the movable part 12 relative to the fixed part 13 can be detected via the sensors 24. The sensors 24 can be designed, for example, as optical sensors 24 that can detect an alteration in the position via a glass measuring scale, either incrementally or in absolute terms. Such sensors 24 are commercially available components, and for this reason their mode of operation is not to be examined here in more detail.

In conjunction with a very rigid design of the manipulator 9, the combination of the three sensors 24, the three linear drives 11 and the annular disk 22 as guide permits an exactly controllable positioning of the optical element 10 in the direction of the optical axis 21 and/or a tilting relative to the optical axis 21. The position of the optical element 10 in the plane perpendicular to the optical axis 11 is ensured in this case by the guidance, the result being a design that is very rigid and not susceptible to vibrations and/or excitation in the region of the natural frequency.

In certain embodiments, in order to guide the movable part 12 relative to the fixed part 13, at least three bar elements 115 are provided that are connected in each case via joints 23 both to the fixed part 13 and to the movable part 12. The movable part 12 can be moved relative to the fixed part 13 by the linear drives 14, whose movement axes 17 run at least approximately parallel to the optical axis 11, the bar elements 115 achieving a guidance of the movable part 13 such that the latter experiences no deflection in the plane perpendicular to the movement axes 17.

Figure 11:
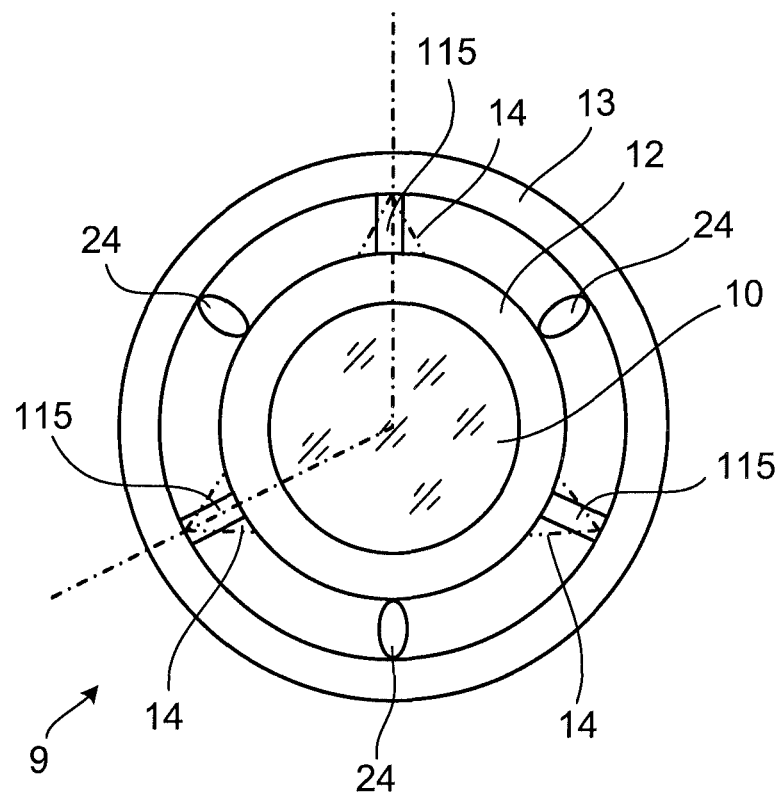
FIG. 11 shows a plan view of an embodiment of a manipulator.

A plan view of a manipulator 9 of such design is to be seen in FIG. 11. Visible once again is the fixed part 13 and the movable part 12 with the optical element 10. The guidance of the movable part 12 and the fixed part 13 is performed via three bar elements 115 that are indicated here only in principle. Located in the region below the bar elements 115 is in each case one of the linear drives 14, which are indicated here in the form of a triangle. Visible in addition to this are three sensors 24, which are indicated here in principle by means of oval structures. The sensors 24 are respectively arranged at an angle of 120° to one another and at an angle of 60°, respectively, relative to the linear drives 14. The exact position of the movable part 12 relative to the fixed part 13 can be detected via the sensors 24. The sensors 24 can be designed, for example, as optical sensors 24 that can detect an alteration in the position via a glass measuring scale, either incrementally or in absolute terms. Suitable principles are known for the sensors 24, and for this reason their mode of operation is not to be examined here in more detail.

Figure 12:
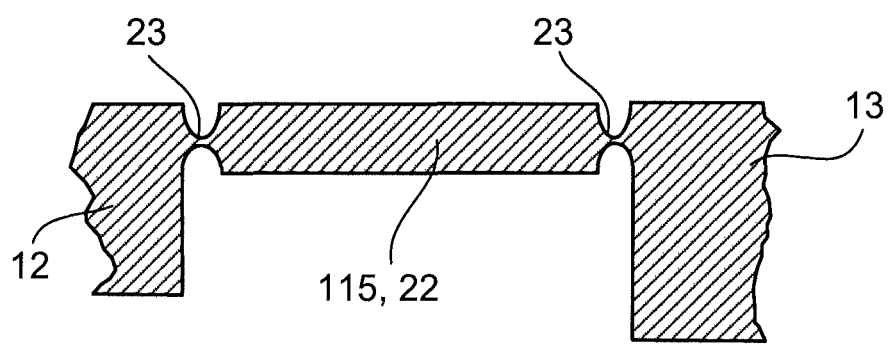
FIG. 12 shows an enlargement of the detail in FIG. 4.

FIG. 12 shows a detailed section through one of the bar elements 115 or through the annular disk 22. Both elements 115, 22 are of at least approximately identical design in cross section, since in the case of the use of bar elements 22, as well, it is very favorable to use solid joints as joints 23 because of the stiffness that is to be achieved.

Visible in the illustration in accordance with FIG. 12 are the fixed part 13 and the movable part 12, which are connected to one another via the bar element 115 and the annular disk 22. As guide element, such a design composed of bar element 115 and annular disk 22 which are pivoted at the two parts 12, 13 to be guided via the joints and solid joints 23 exhibits very favorable mechanical properties. The bar element 115 or the annular disk 22 is designed per se with such a large wall thickness that virtually no deformations of any sort occur in practice in the bar element 115 or the annular disk 22. All the deformations that occur in the region of such a guide element will take place in the region of the joints 23. Since these joints 23, in particular when they are designed as solid joints, are located in a fashion arranged at very exactly defined positions, the behavior of such a guide element can be determined in advance very exactly and very easily from a number of the bar elements 115 or from one annular disk 22. Moreover, it is possible to implement a very high rigidity of the design, and thus a very high natural frequency.

The manipulator 9, which is designed in the way just described, can fulfill the very high requirements that occur in the region of the projection exposure machine 1 for microlithography, and here, in particular, in the imaging device 7. The ideal supplement to such a design is in this case the linear drives 11 which, on the one hand, have a very high accuracy and which, on the other hand, permit a very large range, that is to say the possibility of a very large movement stroke. In the case of such a z- and/or tilting manipulator 9 for use in microlithography, the necessary requirements placed on the resolution are around 0.3 to 0.8 nm for a travel of ±80 to 200 µm. The rigidity to be attained should here in any case be greater than 12-18 N/µm. The required adjusting forces are above 100 N in this case, but this is not a problem for the linear drives 11. The design of the linear drives 11 must permit self-locking for this case of use, which is possible without a problem in the ideal case with an appropriate prestressing of the piezoelectric elements 18, 19, as has already been described above. The self-locking must also hold forces of the order of magnitude of 6 to 8 times the adjusting forces, for example in the case of shock loading.

All these preconditions are achieved ideally by the combination in accordance with the above-described design.

In addition to the lens described in the above exemplary embodiment as optical element 10, a comparable design is, of course, also conceivable with other optical elements 10, for example a mirror. In the case of a somewhat coarser resolution and a larger travel range, generally comparable boundary conditions obtain for such a purpose of use. However, the required rigidity must be still higher here. However, in conjunction with the coarser resolution of approximately 8-12 nm, this can be attained by the appropriate design of the solid joints in the region of the blanks 20.

Figure 6:
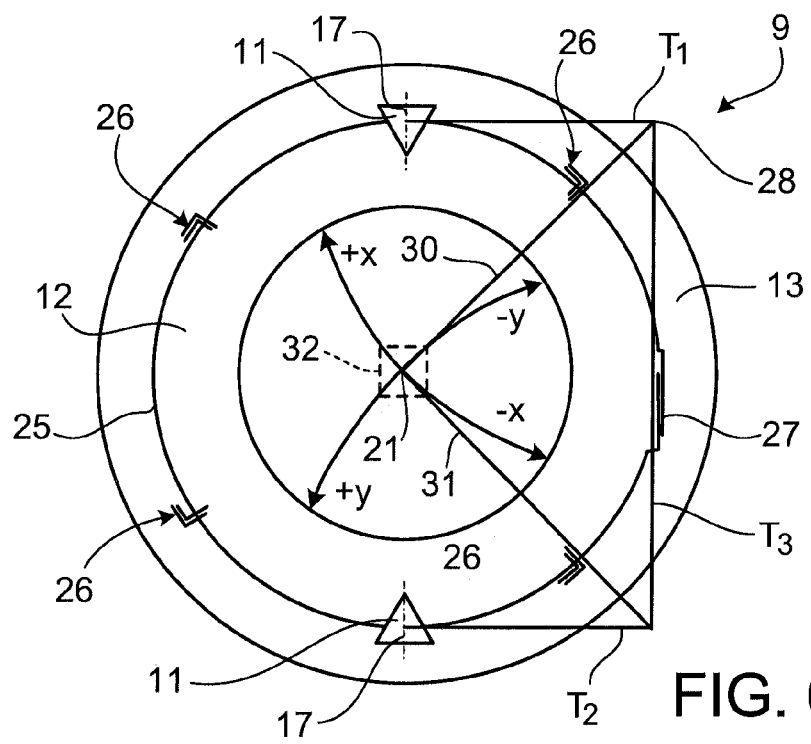
FIG. 6 shows an illustration of the principle of a manipulator for manipulating an optical element in a plane perpendicular to its optical axis.

FIG. 6 shows a plan view of a further embodiment of the manipulator 9, here for the purpose of manipulating the optical element 10 in a plane perpendicular to the optical axis 21. The optical element 10, here a lens, for example, is supported via lugs in a way known per se in a fashion decoupled from deformation in the inner ring, that is to say the movable part 12 of the manipulator 9. The fixed part 13, that is to say the outer ring here, and the inner ring 12 are designed in one piece in the example illustrated here, a flexible connection between the inner ring 12 and the outer ring 13 being created via a system of circumferential slots 25 between the inner ring 12 and the outer ring 13 with interposed connecting elements 26 in the shape of an L. The connecting elements 26 in the shape of an L are designed as solid joints. In addition to a pivot joint 27 and two of the linear drives 11, which are indicated here in principle, they constitute the sole connection between the inner ring 12 and the outer ring 13.

The circumferential slots 25, which are introduced into the single-piece basic form by means of separating cuts, are interrupted at regular intervals by two separating cuts, arranged next to one another at a slight spacing, in the shape of an L, the result being to form the connecting elements 26 as webs between the cuts in the shape of an L. Moreover, the pivot joint 27 is likewise formed by offsetting and overlapping the circumferential slots 25, the pivot joint 27 having a web between the circumferential slots 25, which overlap each other in this region. Instead of the unipartite nature of inner ring 12 and outer ring 13 illustrated here, it is also, however, possible for the connection to be effected via joints in the form of components that are welded in, bonded or soldered.

The circumferential slots 25 are interrupted at two opposite points with the formation of a relatively large cutout (not to be seen here) between the outer ring 13 and the inner ring 12. One of the linear drives 11 is arranged in each case in the two cutouts. Here, in each case the driven subregion 14 is connected to the outer ring 13 and the nondriven subregion 15 is connected to the inner ring 12. This design, which is not to be seen in detail in the illustration of the principle in accordance with FIG. 6, can also be designed in exactly the opposite way, without altering the mode of operation of the manipulator 9. The manipulator 9 is designed as a construction having optimized force closure and safety.

The following conditions and/or assignments are to be observed in order to achieve a desired and predetermined displacement of the inner ring 12 relative to the outer ring 13 in the x-/y-plane:

The pivot joint 27 is to be arranged between the two points of action of the linear drives 11 for displacing the inner ring 12 in such a way that the tangents $T_1$ and $T_2$ at the points of action of the movement axes 17 of the linear drives 11 intersect the tangent $T_3$ applied at the pivot joint 27. The two points of intersection in this case form, firstly, a center of rotation 28 for one of the linear drives 11 for displacing the inner ring 12 in the x-direction and, secondly, a center of rotation 29 for the displacement of the inner ring 12 in the y-direction by the other one of the linear drives 11. It is to be ensured at the same time that the two radials 30 and 31 from the center of rotation 28 and, respectively, the center of rotation 29 to the mid-point or to the optical axis 21 are at right angles to one another. At least in a small region 32 (see the dashed illustration in FIG. 6) around the optical axis 21, the two radials 30 and 31 therefore form the two adjusting axes, the radial 31 defining the x-axis and the radial 30 the y-axis.

Given an actuation of the first linear drive 11, the inner ring 12 therefore rotates about the center of rotation 28, while given an adjustment of the second linear drive 11, the inner ring 12 rotates about the center of rotation 29. This means that, strictly speaking, no linear x-movement or y-movement would result, but since the radii of the radials 30 and 31 are substantially greater than the envisaged adjusting movement, a quasi-linear movement in the x-y plane results in the region 32 already mentioned above, which corresponds to a travel area of the inner ring 12. In order to reset adjusting movements and to increase the rigidity for additional and special loads, it is possible, if appropriate, for leaf springs (not illustrated) to act respectively on the inner ring 12 which are supported with their other ends on the outer ring 13.

The arrangement and configuration of the circumferential slots 25 and the connecting elements 26 results in a high elasticity in the plane (x-y plane) perpendicular to the optical axis 21 (z-axis). Moreover, a high rigidity is provided in the z-direction. This is based, inter alia, on the L shape of the connecting elements 26, which can have an appropriate length in the z-direction and consequently ensure a high rigidity in the z-direction. Just like the connecting elements 26, the pivot joint 27 constitutes a solid joint in the exemplary embodiment. Of course, however, yet other types of joint are also possible for implementing the displacement of the inner ring 12 relative to the outer ring 13. In particular, the use of a third linear drive 11 instead of the pivot joint would also be conceivable here. The angular position of the two axes x and y in the plane defined by them could thereby be varied.

If there is no wish for the ability to travel at right angles, the above-named assignments of the centers of rotation 28, 29 and the pivot joint 27 as well as, if appropriate, of a third linear drive 11 can also be made otherwise.

The manipulator 9, which is designed in the way just described, can fulfill the very high requirements that occur in the region of the projection exposure machine 1 for microlithography, and here, in particular, in the imaging device 7. The ideal supplement to such a design is in this case the linear drives 11 which, on the one hand, have a very high accuracy and which, on the other hand, permit a very large range, that is to say the possibility of a very large movement stroke. In the case of such an x/y manipulator 9 for use in microlithography, the necessary requirements placed on the resolution are around 15 to 25 nm for a travel of ±1 to 2 mm. The rigidity to be attained should here in any case be greater than 5 N/μm. The required adjusting forces are above 30 N in this case, but this is not a problem for the linear drives 11. The design of the linear drives 11 must permit self-locking for this case of use, which is possible without a problem in the ideal case with an appropriate prestressing of the piezoelectric elements 18, 19, as has already been described above. The self-locking must also hold forces of the order of magnitude of 6 to 8 times the adjusting forces, for example in the case of shock loading.

All these preconditions are achieved ideally by the combination in accordance with the above-described design.

Figure 7:
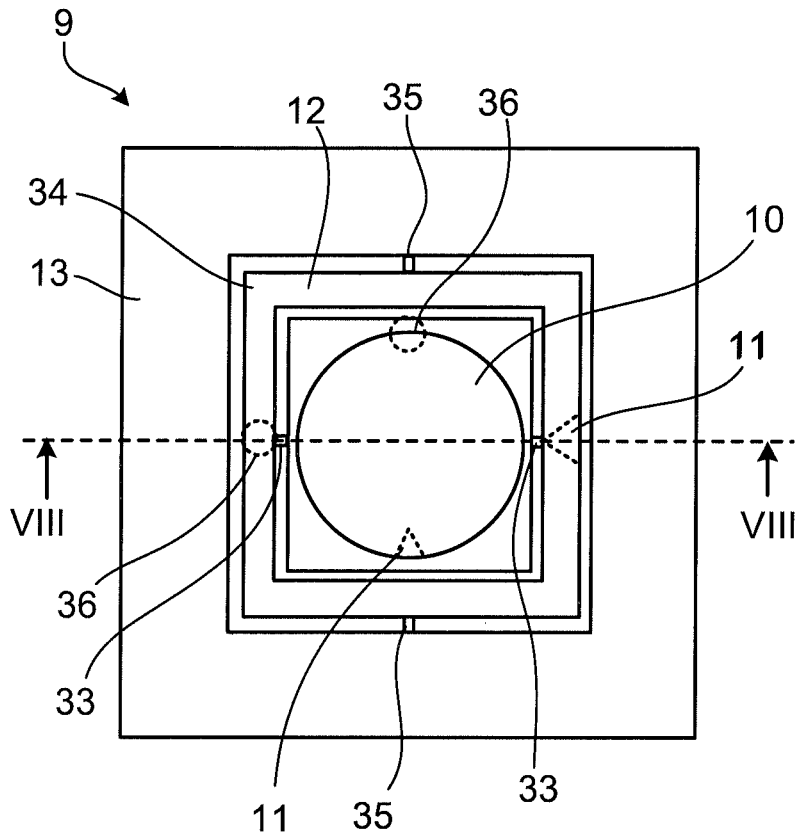
FIG. 7 shows an illustration of the principle of a possible apparatus for manipulating a mirror about two axes, in a plan view.

There is now described in FIG. 7 a further manipulator 9 that serves for manipulating the optical element 10, a mirror in the present case. The design of the manipulator 9 is simplified in this case very strongly down to the basic principles and includes a cardanic suspension of the optical element 10 in the exemplary embodiment illustrated here. The cardanic suspension of the optical element 10 in the manipulator 9 is intended in this case only as example of the principle for all types of manipulators 9 in the case of which linear drives 11 move the optical element about a fixed bearing point—thus, in general, a tilting of the optical element 10.

Moreover, in addition to the plane mirror illustrated here the optical element 10 can also be a concave mirror, a prism, a beam splitter cube or the like, whose manipulation, in particular tilting manipulation, is desired for optimizing the mode of operation of the imaging device 7 of the projection exposure machine 1.

Figure 8:
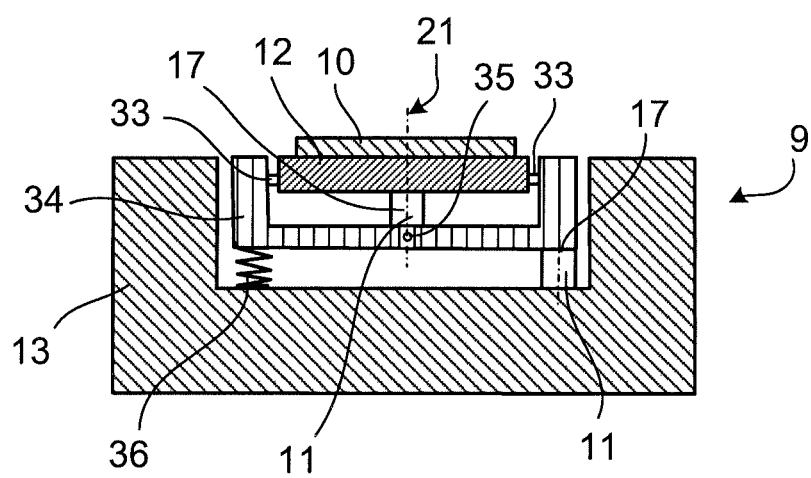
FIG. 8 shows a sectional illustration of the principle in accordance with the line VIII-VIII in FIG. 7.

The manipulator 9 in accordance with the exemplary embodiment illustrated in FIG. 7 and FIG. 8 is designed in this case such that the optical element 10 is permanently connected to the movable part 12 which, in turn, is connected to a movable intermediate frame 34 via bearing and pivot points 33. This intermediate frame 34 is connected to the fixed part 13 of the manipulator 9 via two further bearing and pivot points 35. The perpendicular arrangement, visible in FIG. 7, of the connecting lines of the respective bearing points 33, 35 relative to one another results in a cardanic suspension that is known per se and permits a tilting of the optical element 10 with regard to the optical axis 21 to be seen in FIG. 8. In this case, the required linear drives 11 are indicated in principle in FIG. 7 via the triangles in a similar way as has already been done for the preceding figures.

In the principle of the cross section in accordance with FIG. 8, the linear drives 11 with their movement axes 17 are illustrated once more in greater detail. It may be seen that the movable intermediate frame 34 can be manipulated about the axis of rotation formed by the bearing points 35 via one of the linear drives. In the exemplary embodiment illustrated here in principle, there is indicated a spring device 36 that presses the intermediate frame 31 against the linear drive 11 and thus permits a continuous resetting and zero-backlash connection between the linear drive 11 and the intermediate frame 34. The linear drive 11 also to be seen between the intermediate frame 34 and the movable part 12 functions in a similar way. Of course, it would also be conceivable to implement the restoring force with other means. For example, the gravitational force could be used for resetting in the case of an eccentric arrangement of the axis of rotation.

The design described by FIGS. 7 and 8 is intended in this case to indicate the possibilities of the use of the linear drive 11 only in principle; it is, of course, also possible to conceive of any other designs in the case of which either one or more of the linear drives 11 serve as bearing points, as has been described in the preceding figures, or in the case of which the linear drives 11 are used to manipulate the optical element 10 about one or more fixed fulcrums or bearing points 33, 35.

The following FIGS. 9*a* to 10*b* describe a further possibility of achieving an even higher imaging quality in the area of the imaging device 7.

An analysis, carried out by the inventor, of the aberrations owing to lens heating revealed that in the case of an optical system with an off-axis field it is not the dichromatic aberrations such as anamorphic distortion that supply the largest fraction of the errors after the rotationally symmetric errors such as, for example, field curvature or astigmatism with a square field profile, but the monochromatic aberrations, for example the sagittal and tangential distortion and the constant coma. The following discussion relates to the coma.

FIG. 9*a* shows an optical system that is formed from two lenses 10 and 10'. The beam path through the lenses 10 and 10' is illustrated starting from an object point O. A diaphragm 37 is provided to delimit the light bundle. In this example, the lens 10' is tilted by approximately 12° about an axis perpendicular to the optical axis 21. After the light beams have passed through the two lenses 10 and 10', the beams should intersect again at an image point O'. In addition to other aberrations, the tilting of the lens 10' induces coma for the axial point O'.

An enlarged illustration of the caustic about the image point O' is illustrated in FIG. 9*b*. It is now clearly to be seen here that the object point O cannot be imaged in a punctiform fashion by the two lenses 10 and 10' in conjunction with tilting of the lens 10'. A main beam 38 and edge beams 39 do not meet at the focal point or image point O'. The result is an asymmetric and unsharp image of the object point O' that resembles a comet's tail and is also denoted coma.

In order to correct these aberrations as well as the transverse distortion, it is now possible to make use of the possibility of tilting the newly developed Z manipulator 9 in accordance with the invention. This is implemented in FIG. 10*a*, in which the lens 10 is to be designed here as a Z manipulator. An illustration of the Z manipulator 9 in conjunction with the lens 10 has been dispensed with in this exemplary embodiment for the purpose of simplifying the illustration of the beam path. The lens 10 is now tilted by 0.75°. As is illustrated in FIG. 10*b*, this design of the optical system compensates to a large extent the coma induced on the optical axis 21 by the tilting of the lens 10'. The enlarged caustic in accordance with FIG. 10*b* demonstrates a virtually corrected coma, since the main beam 38 and the edge beams 39 intersect at the image point O'. As is to be expected for this system, other aberrations occur owing to the strong tilting of the two lenses 10 and 10'.

However, this can be avoided by means of simulation calculations performed in advance with the aid of optical computer programs.

Specifically, aberrations owing to asymmetric lens heating, such as the constant coma or the transverse distortion, can now be corrected by displacing lenses 10 perpendicular to the optical axis 21 or by tilting lenses 10.

Depending on the purpose of application, the lenses to be manipulated are intended specifically for a particular design. In the case of conduct of a sensitivity analysis, and with the aid of its results, it is possible to select lenses that are suitable both as Z manipulators 9 and for correcting monochromatic errors (coma, distortion) by tilting. Their use leads to a substantially improved imaging quality.

The Z manipulator 9 according to the invention additionally permits the correction of errors that are introduced inadvertently into the system by the imperfect operation of the conventional manipulators.

It is therefore likewise possible now to correct even monochromatic aberrations with the aid of this manipulator type 9. The manipulations of the lenses 10 can be performed individually or in combination by z-displacement of the lenses 10 along the optical axis 21 or by tilting the lenses 10. It is therefore now also possible to correct asymmetric aberrations that are caused by lens heating.

What is claimed is:

1. A system, comprising:
an optical element; and
a manipulator coupled to the optical element,
wherein:
the manipulator is configured so that during operation the manipulator varies a position the optical element;
the manipulator has a resolution and a range;
a ratio of the resolution to the range is 1:75,000 or more; and
the system is a microlithography projection system.

2. The system of claim 1, wherein the resolution is from 0.3 nm to 0.8 nm.

3. The system of claim 2, wherein the range is from ±80 microns to 200 microns.

4. The system of claim 1, wherein the range is from ±80 microns to 200 microns.

5. The system of claim 1, wherein:
the manipulator comprises a first portion and a second portion;
the first portion is fixed with respect to a frame of the system;
the second portion is attached to the optical element; and
the second portion is linearly moveable with respect to the first portion.

6. The system of claim 5, wherein the manipulator further comprises one or more piezoelectric elements that couple the first portion to the second portion.

7. The system of claim 6, wherein the piezoelectric elements comprise shearing piezoelectric elements.

8. The system of claim 6, wherein:
the piezoelectric elements comprise a first piezoelectric element and a second piezoelectric element;
the first piezoelectric element is positioned on a first side of the second portion;
the second piezoelectric element is positioned on a second side of the second portion;
the first side of the second portion is opposite the second side of the second portion; and
during operation, the first and second piezoelectric elements clamp the second portion to position the second portion relative to the first portion.

9. The system of claim 8, wherein the manipulator is within a space between the first and second portions.

10. The system of claim 8, wherein the manipulator is integrated into a mounting apparatus which mounts the optical element to a frame of the system.

11. The system of claim 1, wherein the manipulator is a component of a mounting apparatus which mounts the optical element to a frame of the system.

12. A machine, comprising:
an illumination system; and
a system according to claim 1,
wherein the machine is a microlithography projection exposure machine.

13. A system, comprising:
an optical element;
a frame; and
a mounting apparatus which couples the optical element to the frame, the mounting apparatus comprising:
    a first portion fixedly attached to the frame;
    a second portion fixedly attached to the optical element; and
    a manipulator which couples the first and second portions,
wherein:
    the manipulator is configured so that during operation the manipulator varies a position of the optical element;
    the manipulator has a resolution and a range;
    a ratio of the resolution to the range is 1:75,000 or more; and
    the system is a microlithography projection system.

14. A system, comprising:
an optical element;
a frame;
a sensor; and
a mounting apparatus which couples the optical element to the frame, the mounting apparatus comprising:
    a first portion attached to the frame;
    a second portion attached to the optical element; and
    a manipulator configured so that during operation the manipulator varies a position of the optical element,
wherein:
    the manipulator has a resolution and a range;
    a ratio of the resolution to the range is 1:75,000;
    the sensor is configured to monitor a position of the optical element relative to the frame; and
    the system is a microlithography projection system.

15. The system of claim 14, wherein the sensor is an optical sensor.

16. The system of claim 15, wherein the optical sensor comprises a glass measuring scale.

17. The system of claim 14, wherein the system comprises a plurality of sensors configured to monitor the position of the optical element relative to the frame, and the plurality of sensors are arranged symmetrically with respect to an optical axis of the system.

18. The system of claim 14, wherein the system comprises three sensors and three manipulators, and the three sensors and the three manipulators are arranged symmetrically with respect to an optical axis of the system.

19. The system of claim 14, wherein the sensor is configured to monitor an absolute position of the optical element relative to the frame.

20. The system of claim 14, wherein the sensor is configured to monitor an incremental position of the optical element relative to the frame.

* * * * *

UNITED STATES PATENT AND TRADEMARK OFFICE
CERTIFICATE OF CORRECTION

PATENT NO. : 8,514,371 B2  
APPLICATION NO. : 13/096112  
DATED : August 20, 2013  
INVENTOR(S) : Wolfgang Hummel et al.

Page 1 of 1

It is certified that error appears in the above-identified patent and that said Letters Patent is hereby corrected as shown below:

In the Specification

Col. 10, line 66, delete "a the" and insert -- the --.

In the Claims

Col. 16, line 32, In Claim 1, delete "the" and insert -- of the --.

Signed and Sealed this
Fifth Day of November, 2013

Teresa Stanek Rea
*Deputy Director of the United States Patent and Trademark Office*